(12) United States Patent
Takano et al.

(10) Patent No.: US 12,375,057 B2
(45) Date of Patent: Jul. 29, 2025

(54) METHOD OF MANUFACTURING A SELF-SHIELDED ACOUSTIC WAVE DEVICE PACKAGE

(71) Applicant: Skyworks Solutions, Inc., Irvine, CA (US)

(72) Inventors: Atsushi Takano, Kadoma (JP); Mitsuhiro Furukawa, Nishinomiya (JP); Takeshi Furusawa, Toyonaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 648 days.

(21) Appl. No.: 17/655,886

(22) Filed: Mar. 22, 2022

(65) Prior Publication Data

US 2022/0321081 A1 Oct. 6, 2022

Related U.S. Application Data

(60) Provisional application No. 63/200,855, filed on Mar. 31, 2021, provisional application No. 63/200,857, filed on Mar. 31, 2021.

(51) Int. Cl.
*H03H 9/10* (2006.01)
*H01L 23/04* (2006.01)
*H03H 3/02* (2006.01)
*H03H 9/05* (2006.01)
(Continued)

(52) U.S. Cl.
CPC .......... *H03H 9/1007* (2013.01); *H01L 23/04* (2013.01); *H03H 3/02* (2013.01); *H03H 9/0504* (2013.01); *H03H 9/17* (2013.01); *H03H 9/568* (2013.01); *H01L 2924/16152* (2013.01); *H01L 2924/16195* (2013.01)

(58) Field of Classification Search
CPC ...... H03H 9/1007; H03H 3/02; H03H 9/0504; H03H 9/17; H03H 9/568; H03H 9/02535; H01L 23/04; H01L 2924/16152; H01L 2924/16195
See application file for complete search history.

(56) References Cited

U.S. PATENT DOCUMENTS 10,793,419 B2 * 10/2020 Fueldner ............... B81B 7/0077
10,873,311 B2 12/2020 Ando et al.
2006/0012021 A1 1/2006 Larson, III et al.
(Continued)

FOREIGN PATENT DOCUMENTS

CN 108667437 A * 10/2018 ......... H03H 9/02015
CN 112350680 A * 2/2021
(Continued)

*Primary Examiner* — Alonzo Chambliss
(74) *Attorney, Agent, or Firm* — Knobbe, Martens, Olson & Bear LLP

(57) ABSTRACT

A method of manufacturing a packaged acoustic wave component includes forming or providing a cap substrate. The method also includes forming a metal shield plate on a surface of the cap substrate. The cap substrate is attached to a device substrate that has an acoustic wave device on a surface thereof such that the metal shield plate is spaced from and faces the acoustic wave device and so that a peripheral metal wall extends between the device substrate and the metal plate. The metal shield plate and peripheral metal wall enclose and electrically shield the acoustic wave device.

20 Claims, 11 Drawing Sheets

(51) Int. Cl.
   *H03H 9/17*   (2006.01)
   *H03H 9/56*   (2006.01)

(56) References Cited

U.S. PATENT DOCUMENTS

| | | |
|---|---|---|
| 2013/0313947 A1 | 11/2013 | Chen et al. |
| 2017/0179919 A1 | 6/2017 | Yang et al. |
| 2018/0123557 A1* | 5/2018 | Sung ................ B81B 7/0064 |
| 2018/0159503 A1* | 6/2018 | Takano ............... B23K 1/0016 |
| 2018/0234076 A1* | 8/2018 | Ando ................ H03H 9/02086 |
| 2019/0319772 A1 | 10/2019 | Ando et al. |
| 2020/0321940 A1* | 10/2020 | Cheon ................ H03H 9/0547 |
| 2021/0098683 A1 | 4/2021 | Iwabuchi et al. |
| 2021/0099157 A1 | 4/2021 | Takano et al. |
| 2021/0376810 A1 | 12/2021 | Kim et al. |
| 2022/0321090 A1 | 10/2022 | Takano et al. |

FOREIGN PATENT DOCUMENTS

| | | | | |
|---|---|---|---|---|
| JP | 2012084954 A | * | 4/2012 | ........... H03H 9/1092 |
| KR | 2020118610 A | * | 10/2020 | ......... H03H 9/02007 |

* cited by examiner

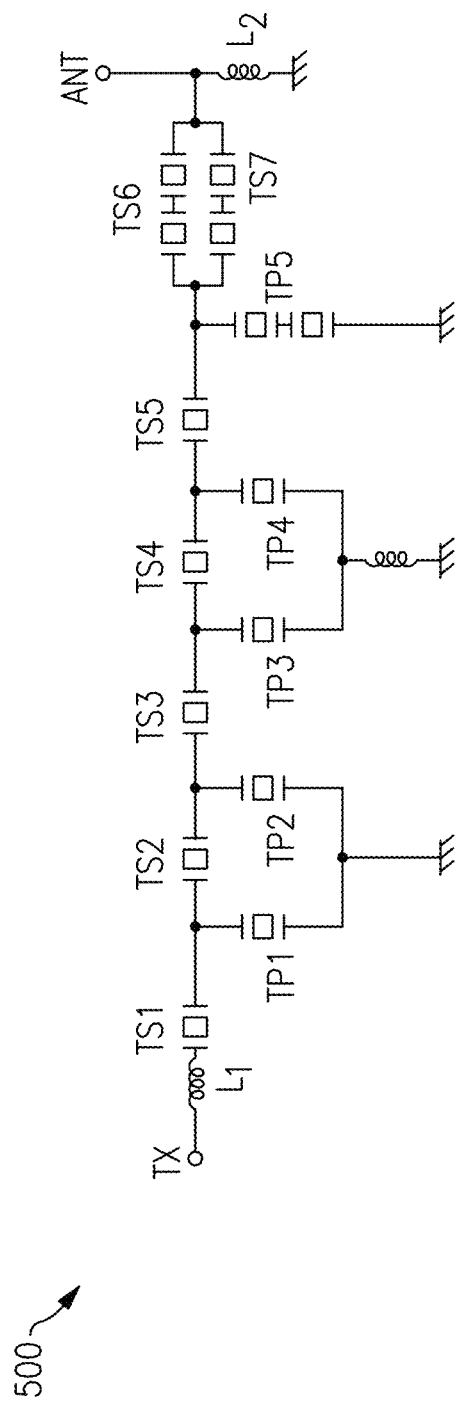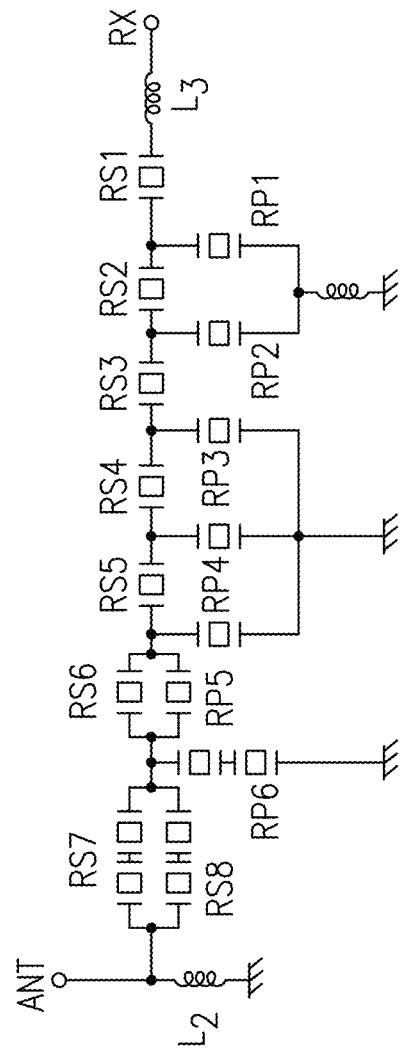
FIG.8A
FIG.8B

METHOD OF MANUFACTURING A SELF-SHIELDED ACOUSTIC WAVE DEVICE PACKAGE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include bulk acoustic wave (BAW) filters. However, such acoustic wave filters operate at a high frequency range, making size reduction of packages including BAW filters difficult.

SUMMARY

In accordance with one aspect of the disclosure, a bulk acoustic wave (BAW) device package is provided with improved electrical shielding of the BAW resonator to reduce (e.g., inhibit, prevent) floating capacitance between the BAW device package and other electrical components and allows for the reduction in the module size.

In accordance with one aspect of the disclosure, a packaged acoustic wave component is provided. The packaged acoustic wave component comprises an acoustic wave device mounted on a device substrate and a cap substrate spaced above the device substrate. The packaged acoustic wave component also comprises a shield structure including a metal plate disposed on a bottom surface of the cap substrate that faces the device substrate, the metal plate being spaced above the acoustic wave device, and a peripheral metal wall attached to the metal plate that extends to the device substrate. The shield structure encloses and electrically shields the acoustic wave device.

In accordance with another aspect of the disclosure, a radio frequency module is provided. The radio frequency module comprises a package substrate and a packaged acoustic wave component. The packaged acoustic wave component includes an acoustic wave device mounted on a device substrate, and a cap substrate spaced above the device substrate. The packaged acoustic wave component also includes a shield structure including a metal plate disposed on a bottom surface of the cap substrate that faces the device substrate, the metal plate being spaced above the acoustic wave device, and a peripheral metal wall attached to the metal plate that extends to the device substrate. The shield structure encloses and electrically shielding the acoustic wave device. The radio frequency module also comprises additional circuitry, the packaged acoustic wave component and additional circuitry disposed on the package substrate.

In accordance with another aspect of the disclosure, a wireless communication device is provided. The wireless communication device comprises an antenna and a front end module including one or more packaged acoustic wave components configured to filter a radio frequency signal associated with the antenna. Each packaged acoustic wave component includes an acoustic wave device mounted on a device substrate, a cap substrate spaced above the device substrate, and a shield structure. The shield structure includes a metal plate disposed on a bottom surface of the cap substrate that faces the device substrate, the metal plate being spaced above the acoustic wave device, and a peripheral metal wall attached to the metal plate that extends to the device substrate. The shield structure encloses and electrically shields the acoustic wave device.

In accordance with another aspect of the disclosure, a method for manufacturing a packaged acoustic wave component is provided. The method comprises forming or providing a cap substrate and forming a metal shield plate on a surface of the cap substrate. The method also comprises bonding the cap substrate to a device substrate that has an acoustic wave device on a surface thereof such that the metal shield plate is spaced from and faces the acoustic wave device and so that a peripheral metal wall extends between the device substrate and the metal plate. The metal shield plate and peripheral metal wall encloses and electrically shields the acoustic wave device.

In accordance with another aspect of the disclosure, a method of manufacturing a packaged acoustic wave component is provided. The method comprises forming or providing a cap substrate and forming a metal shield plate on a surface of the cap substrate. The method also comprises forming a peripheral metal wall attached to the metal plate, forming or providing a device substrate, and mounting an acoustic wave device on a surface of the device substrate. The method further comprises stacking the cap substrate over the device substrate so that the peripheral metal wall extends toward the device substrate and so that the metal shield plate faces the acoustic wave device. The metal shield plate and peripheral metal wall electrically shield the acoustic wave device.

BRIEF DESCRIPTION OF THE DRAWINGS

Embodiments of this disclosure will now be described, by way of non-limiting example, with reference to the accompanying drawings.

FIG. 8A is a schematic diagram of a transmit filter that includes an acoustic wave resonator according to an embodiment.

FIG. 8B is a schematic diagram of a receive filter that includes an acoustic wave resonator according to an embodiment.

DETAILED DESCRIPTION

Figure 1:
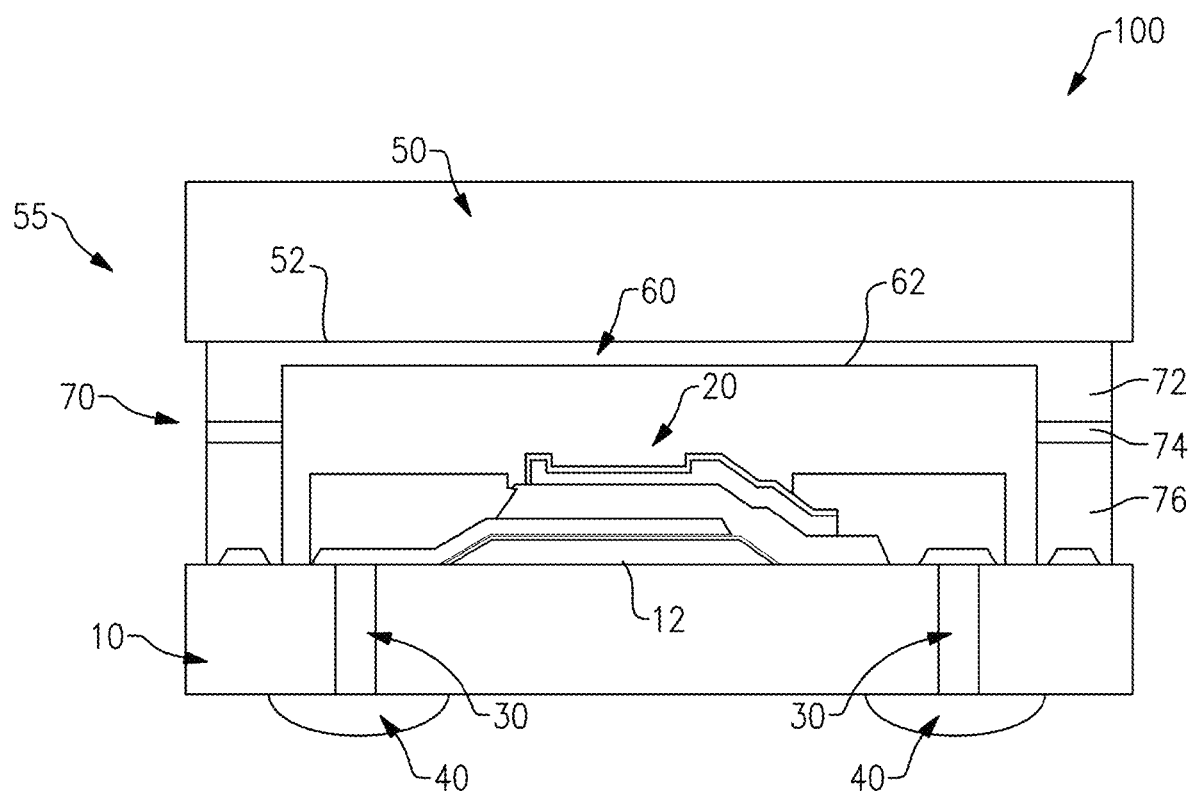
FIG. 1 illustrates a schematic cross-sectional side view of a bulk acoustic wave device structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with bulk acoustic wave (BAW) devices.

FIG. 1 illustrates a bulk acoustic wave (BAW) package or component 100 with a bulk acoustic wave (BAW) resonator or device 20 disposed on (e.g., mounted to) a surface 12 of the device substrate 10. The BAW resonator 20 can be electrically connected to terminals 40 (e.g., on an opposite surface of the device substrate 10 from the top surface 12) by vias 30 that extend through the device substrate 10. The terminals 40 can be ball grid array (BGA) terminals. In another example, the terminals 40 can be land grid array (LGA) terminals.

The BAW package or component 100 includes a cap substrate 50 disposed over and spaced from the device substrate 10. In one implementation, the cap substrate 50 and the device substrate 10 can be made of the same material. For example, the cap substrate 50 and the device substrate 10 can be made of silicon. In one implementation, the cap substrate 50 and the device substrate 10 can be made of high resistance silicon. In another implementation (see FIG. 2), the cap substrate 50 can be made of low resistance silicon and the device substrate 10 can be made of high resistance silicon.

The BAW package or component 100 includes a shield structure 55 that is disposed about the BAW resonator or device 20 and that electrically shields the BAW resonator or device 20 from other electrical components (e.g., on the same printed circuit board or PCB). The shield structure 55 includes a metal plate 60 disposed on a surface 52 of the cap substrate 50 that faces the BAW resonator 20. The metal plate 60 can be made of one or more metal layers. The metal plate 60 can be substantially planar (e.g., flat). The metal plate 60 can span across the BAW resonator 20. The metal plate 60 can cover approximately an entire area of the surface 52 (e.g., peripherally or circumferentially) that covers the BAW resonator 20. In one example, the metal plate 60 can be made of copper (Cu). In other implementations, other suitable materials can be used. In one example, the metal plate 60 has a thickness of approximately 5 um, which the inventors have found provides the desired electrical shielding of the BAW resonator 20 and inhibits (e.g., prevents) floating capacitance between the BAW resonator 20 and other electrical components on the PCB. A bottom surface 62 of the metal plate 60 is spaced above the BAW resonator 20 by between approximately 7 um and 13 um. In one example, the bottom surface 62 of the metal plate 60 is spaced above the BAW resonator 20 by approximately 10 um.

With continued reference to FIG. 1, the shield structure 55 includes a peripheral wall 70 that circumscribes (e.g., surrounds) the BAW resonator 20. A space between the BAW resonator 20 and the shield structure 55 can be under vacuum. The peripheral wall 70 extends between (e.g., from) the metal plate 60 to the device substrate 10. The peripheral wall 70 can have a first portion 76 attached to the device substrate 10, a second portion 72 attached to the metal plate 60 and a third portion 74 interposed between the first portion 76 and the second portion 72. In one example, the second portion 72 can be a single piece (e.g., monolithic, seamless) with the metal plate 60 and made of the same material as the metal plate 60. In one example, the first portion 76 can be made of a different material than the material of the second portion 72; in another example, the first portion 76 can be made of the same material as the second portion 72. In an example, the third portion 74 can be made of a material different than the first portion 76 and the second portion 72. In one implementation, the first portion 76 can be made of gold (Au) (e.g., gold plating), the second portion 72 can be made of copper (Cu) (e.g., copper plating), and the third portion 74 can be made of tin (Sn) (e.g., tin plating). In another implementation, the first portion 76 and the second portion 72 can be made of copper (Cu) (e.g., copper plating), and the third portion 74 can be made of tin (Sn) (e.g., tin plating). In one implementation, the first portion 76 can be made with the process for making the device substrate or wafer 10. In one implementation, the second portion 72 can be made with the process for making the cap substrate or wafer 50.

The distance between the top surface 12 of the device substrate 10 and the surface 52 of the cap substrate 50 is approximately 20 um. In one example, a length of the second portion 72 extending from the bottom surface 62 of the metal plate 60 toward the device substrate 10 is approximately 10 um, a length of the first portion 76 extending from the device substrate 10 toward the cap substrate 50 is approximately 3 um, and a length of the third portion 74 interposed between the first portion 76 and second portion 72 is approximately 2.3 um. In one example, a width of the first portion 76 is approximately 35 um, a width of the second portion 72 is approximately 25 um, and a width of the third portion 74 is approximately 30 um. The third portion 74 can form a fillet between the first portion 76 and the second portion 72. In one example, a distance between an inner surface of the first portion 76 and the BAW resonator 20 is approximately at least 10 um (e.g., 10-20 um).

Advantageously, the shield structure 55 inhibits (e.g. prevents) a floating capacitance between the BAW resonator 20 and other electrical components on the same printed circuit board, resulting in better filter performance. Additionally, because the shield structure 55 inhibits (e.g., prevents) a floating capacitance between the BAW resonator 20 and other electrical components on the same PCB (e.g., of a filter), the components can be placed closer together (on the PCB), advantageously resulting in a reduction in the size of the module (e.g., filter module).

Figure 2:
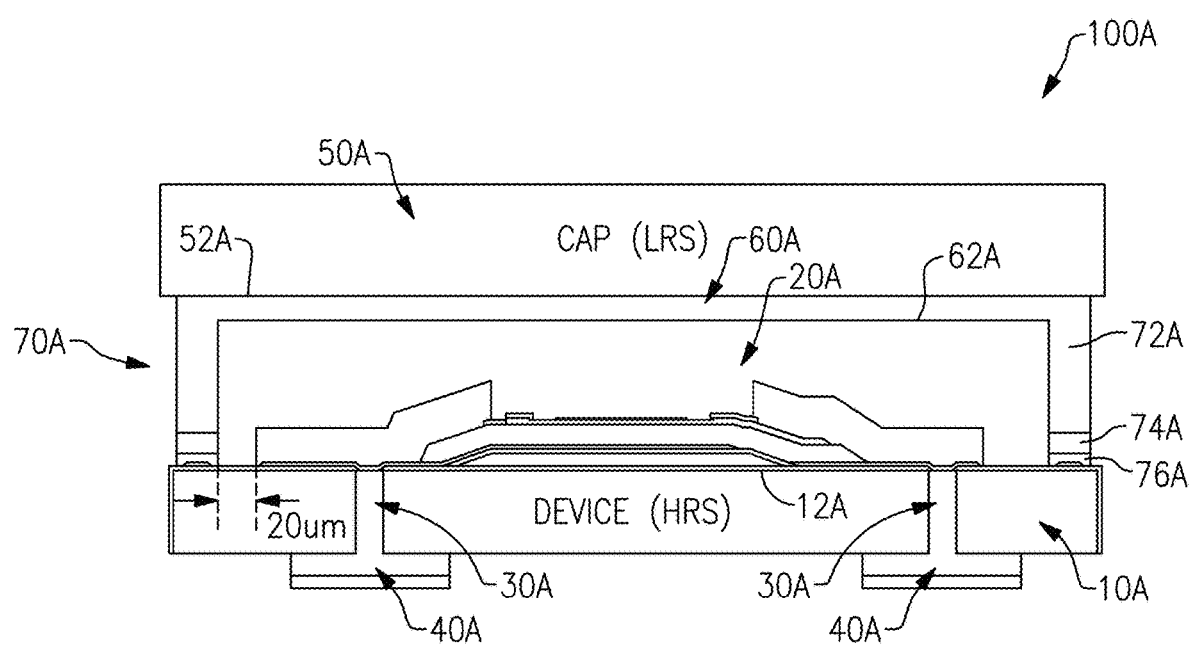
FIG. 2 illustrates a schematic cross-sectional side view of a bulk acoustic wave device structure.

FIG. 2 schematically illustrates a BAW package or component 100A. Some of the features of the BAW package or component 100A are similar to features of the BAW package or component 100 in FIG. 1. Thus, reference numerals used to designate the various components of the BAW package or component 100A are identical to those used for identifying the corresponding components of the BAW package or component 100 in FIG. 1, except that an "A" has been added to the numerical identifier. Therefore, the structure and description for the various features of the BAW package 100 in FIG. 1 are understood to also apply to the corresponding features of the BAW package 100A in FIG. 2, except as described below.

The BAW package or component 100A differs from the BAW package or component 100 in that the cap substrate 50A is made of a low resistance silicon and the device substrate 10A is made of a high resistance silicon. Additionally, the terminals 40A of the BAW package 100A are LGA terminals. Also, the inner surface of the peripheral wall 70A is spaced from the BAW resonator 20A by approximately 20 um.

Figure 3:
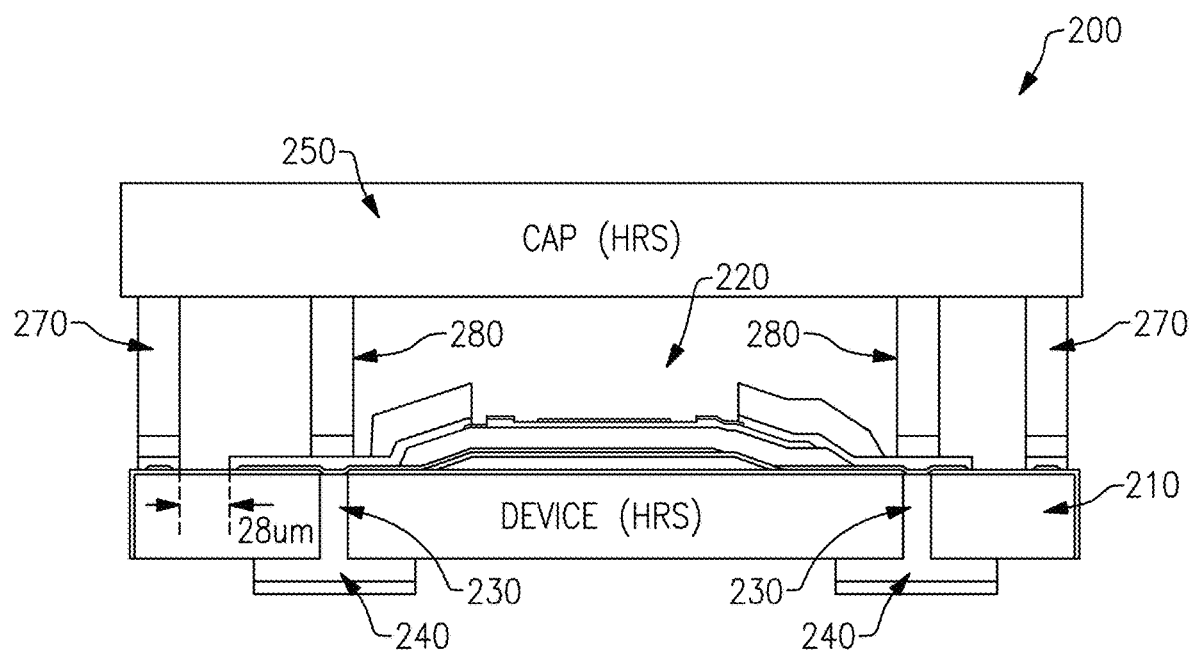
FIG. 3 illustrates a schematic cross-sectional side view of a conventional bulk acoustic wave device structure.

FIG. 3 schematically illustrates a conventional BAW package or component 200 with a bulk acoustic wave (BAW) resonator or device 220 disposed on (e.g., mounted to) a surface of a device substrate 210. The BAW resonator 220 can be electrically connected to terminals 240 by vias 230 that extend through the device substrate 210. The terminals 240 are land grid array (LGA) terminals.

The BAW package or component 200 has a cap substrate 250 disposed over and spaced from the device substrate 210. The cap substrate 250 and the device substrate 210 are made of high resistance silicon. A peripheral wall 270 surrounds the BAW resonator 220. Additionally, pillars 280 extend between and connect the cap substrate 250 and the BAW resonator 220. A distance between an inner surface of the peripheral wall 270 and the BAW resonator 220 is approximately 28 um.

Figure 4:
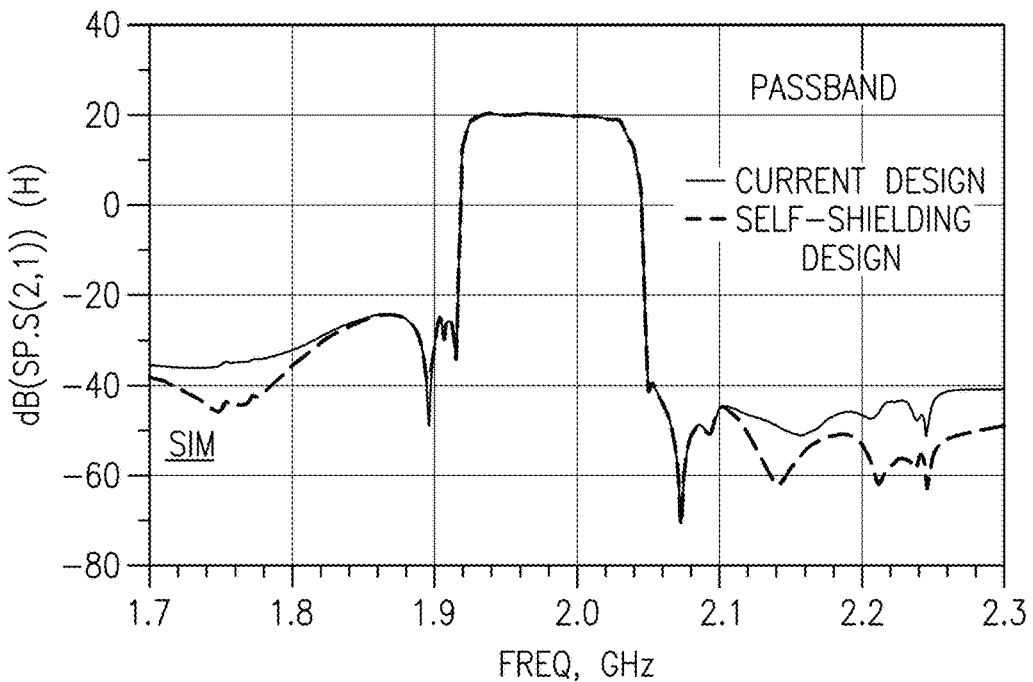
FIG. 4 illustrates a graph of acoustic response versus frequency comparing the performance of the bulk acoustic wave device structure of FIG. 2 with the conventional bulk acoustic wave device structure of FIG. 3.
Figure 5:
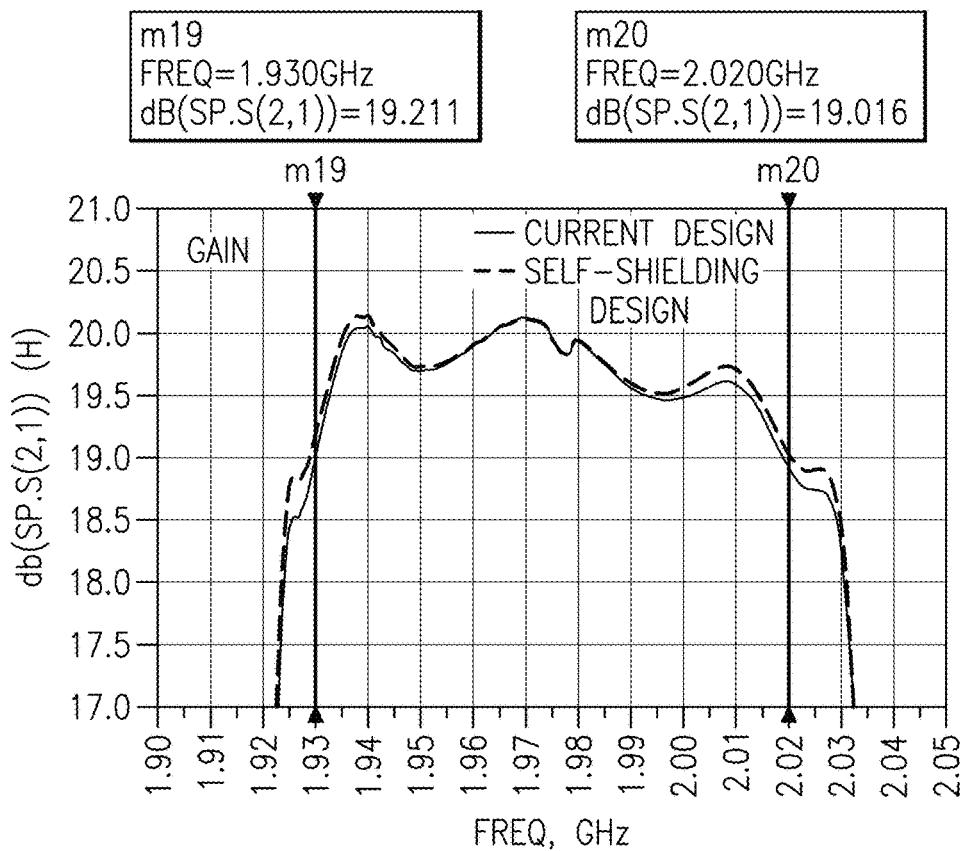
FIG. 5 illustrates a graph of acoustic response versus frequency comparing the performance of the bulk acoustic wave device structure of FIG. 2 with the conventional bulk acoustic wave device structure of FIG. 3.

FIGS. 4 and 5 compare the electrical performance of the BAW package or component 100A and the BAW package or component 200. FIG. 4 shows the electrical filter response for the BAW package 100A and the BAW package 200 in the passband. As shown in FIG. 4, the filter response of the BAW package 100A has higher attenuation and so has a higher stop band than the BAW package 200. FIG. 5 shows the gain response for the BAW package 100A and the BAW package 200. As shown in FIG. 4, the BAW package 100A exhibits greater gain relative to the BAW package 200. Accordingly, the BAW package 100A has a better electrical performance than the BAW package 200.

Figure 6:
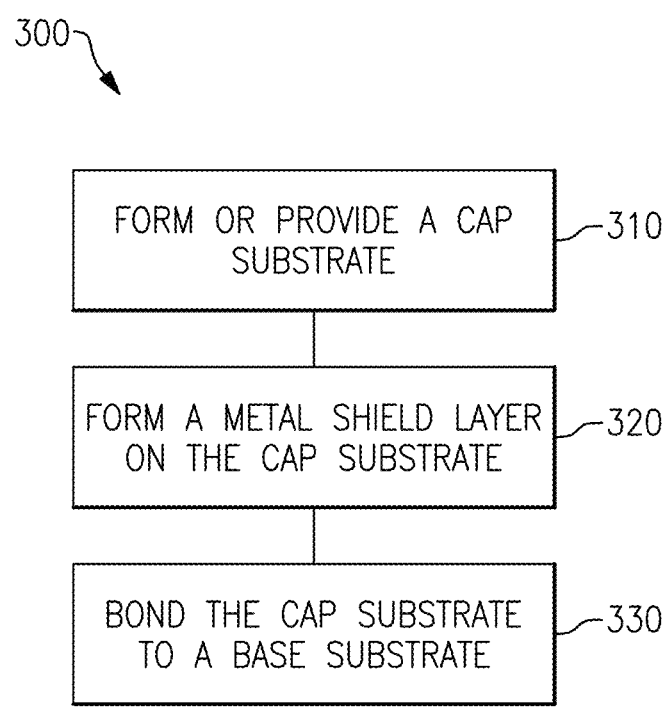
FIG. 6 illustrates a process of making a bulk acoustic wave device structure.
Figure 7:
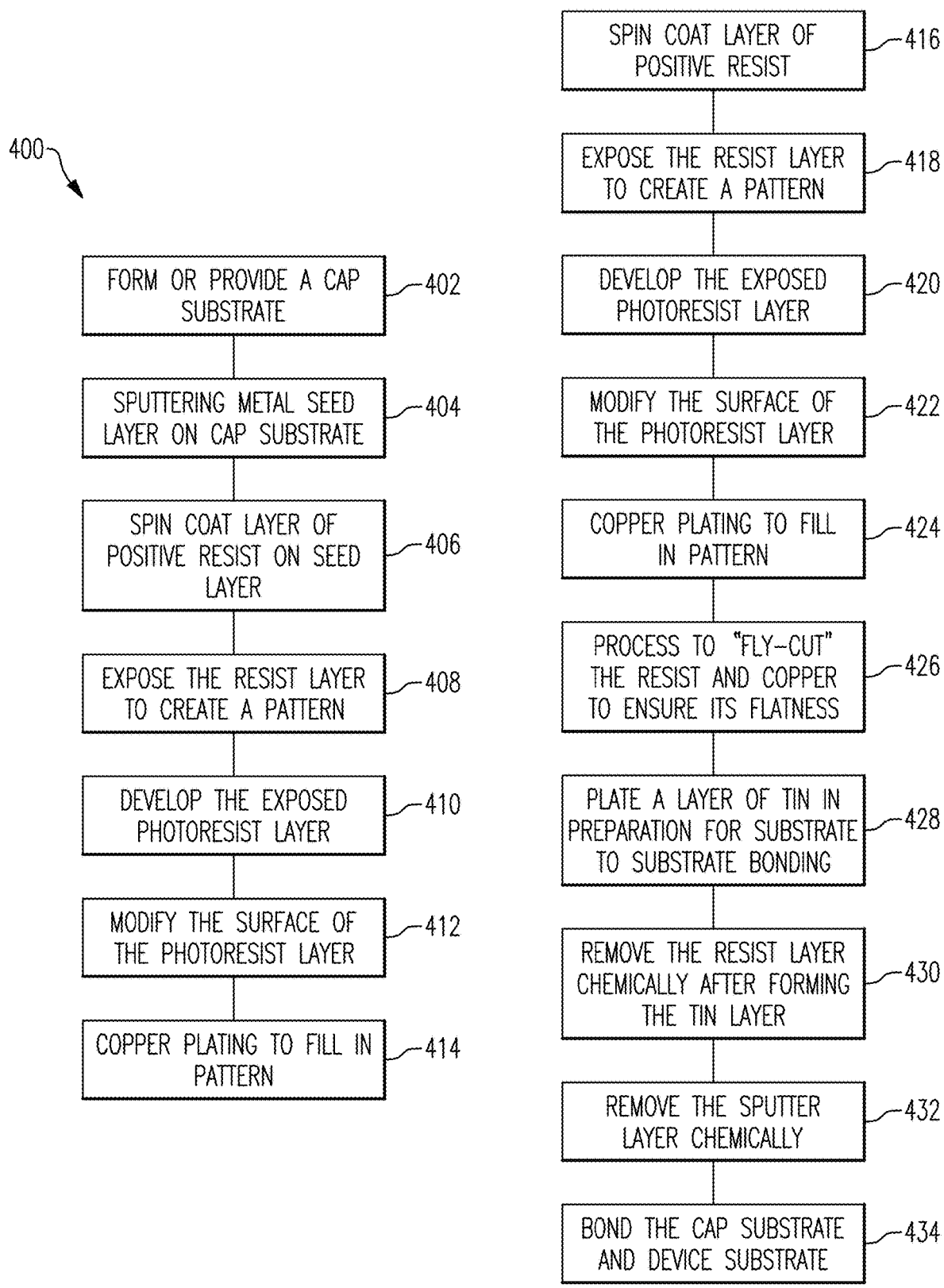
FIG. 7 illustrates a process of making a bulk acoustic wave device structure.

FIGS. 6-7 illustrate flowcharts of methods or processes for making or manufacturing a packaged acoustic wave component, such as the BAW package or component 100 or the BAW package or component 100A. FIG. 6 shows a method or process 300 for making a shielded BAW package, such as the BAW package 100 or 100A. The process 300 includes the step of forming or providing 310 a cap substrate. The process 300 also includes the step of forming 320 a metal shield plate on a surface (e.g., the surface 52 of the cap substrate 50 in FIG. 1) of the cap substrate. The process 300 also includes the step of bonding 330 the cap substrate to a device substrate (such as the device substrate 10 in FIG. 1). The device substrate can have an acoustic wave device on a surface thereof such that the metal shield plate is spaced from and faces the acoustic wave device. A peripheral metal wall (such as the peripheral metal wall 70 in FIG. 1) extends between the device substrate and the metal plate, where the metal shield plate and the peripheral metal wall encloses and electrically shields the acoustic wave device. In some implementations, the process further comprises forming or providing a device substrate, mounting an acoustic wave device on a surface of the device substrate, and stacking the cap substrate over the device substrate so that the peripheral metal wall extends toward the device substrate and so that the metal shield plate faces the acoustic wave device.

FIG. 7 shows a method or process 400 of making or manufacturing a packaged acoustic wave component, such as the shielded BAW package 100 or 100A. The method 400 includes the step of forming or providing 402 a cap substrate (such as the cap substrate 50, 50A), followed by the stop of sputtering 404 a metal seed layer (e.g., Titanium and Copper seed layer) on the cap substrate. The method 400 also includes the step of spin coating 406 a layer of positive resist on top of the metal seed layer, followed by the step of exposing 408 the resist layer to create a pattern. The method 400 also includes the step of developing 410 the exposed photoresist layer, followed by the step of modifying 412 the surface of the photoresist layer to prepare it for copper plating. The method 400 also includes the step of copper plating 414 to fill in the patterns formed by the photolithography process, followed by the step of spin coating 416 a layer of positive resist on top of the copper plated layer, which is followed by the step of exposing 418 the resist layer to create a pattern. The method 400 also includes the step of developing 420 the exposed photoresist layer, followed by the step of modifying 422 the surface of the photoresist layer to prepare it for copper plating. The method 400 also includes the step of copper plating 424 to fill in the patterns formed by the photolithography process, followed by the step of surface planning 426 to "fly-cut" the resist and copper to ensure its flatness. The method 400 also includes the step of plating 428 a layer of tin in preparation for wafer to wafer bonding, followed by the step of removing 430 the resist layer chemically after forming the tin layer. The method 400 also includes the step of etching 432 the sputter layer chemically, followed by the step of bonding 434 the cap substrate or wafer (such as the cap substrate 50, 50A) to a device substrate or wafer (such as the devise substrate 10, 10A).

FIG. 8A is a schematic diagram of an example transmit filter 500 that includes acoustic wave resonators according to an embodiment. The transmit filter 500 can be a band pass filter. The illustrated transmit filter 500 is arranged to filter a radio frequency signal received at a transmit port TX and provide a filtered output signal to an antenna port ANT. Some or all of the resonators TS1 to TS7 and/or TP1 to TP5 can be a BAW resonator in accordance with any suitable principles and advantages disclosed herein. For instance, one or more of the BAW resonators of the transmit filter 500 can be an acoustic wave device 20, 20A of a packaged acoustic wave components 100, 100A of FIGS. 1-2. Alternatively or additionally, one or more of the BAW resonators of the transmit filter 500 can be any acoustic wave resonator disclosed herein. Any suitable number of series BAW resonators and shunt BAW resonators can be included in a transmit filter 500.

FIG. 8B is a schematic diagram of a receive filter 505 that includes bulk acoustic wave resonators according to an embodiment. The receive filter 505 can be a band pass filter. The illustrated receive filter 505 is arranged to filter a radio frequency signal received at an antenna port ANT and provide a filtered output signal to a receive port RX. Some or all of the resonators RS1 to RS8 and/or RP1 to RP6 can be BAW resonators in accordance with any suitable principles and advantages disclosed herein. For instance, one or more of the BAW resonators of the receive filter 505 can be an acoustic wave device 20, 20A of a packaged acoustic wave components 100, 100A of FIGS. 1-2. Alternatively or additionally, one or more of the BAW resonators of the receive filter 505 can be any acoustic wave resonator disclosed herein. Any suitable number of series BAW resonators and shunt BAW resonators can be included in a receive filter 505.

Although FIGS. 8A and 8B illustrate example ladder filter topologies, any suitable filter topology can include a BAW resonator in accordance with any suitable principles and advantages disclosed herein. Example filter topologies include ladder topology, a lattice topology, a hybrid ladder and lattice topology, a multi-mode BAW filter, a multi-mode BAW filter combined with one or more other BAW resonators, and the like.

Figure 9:
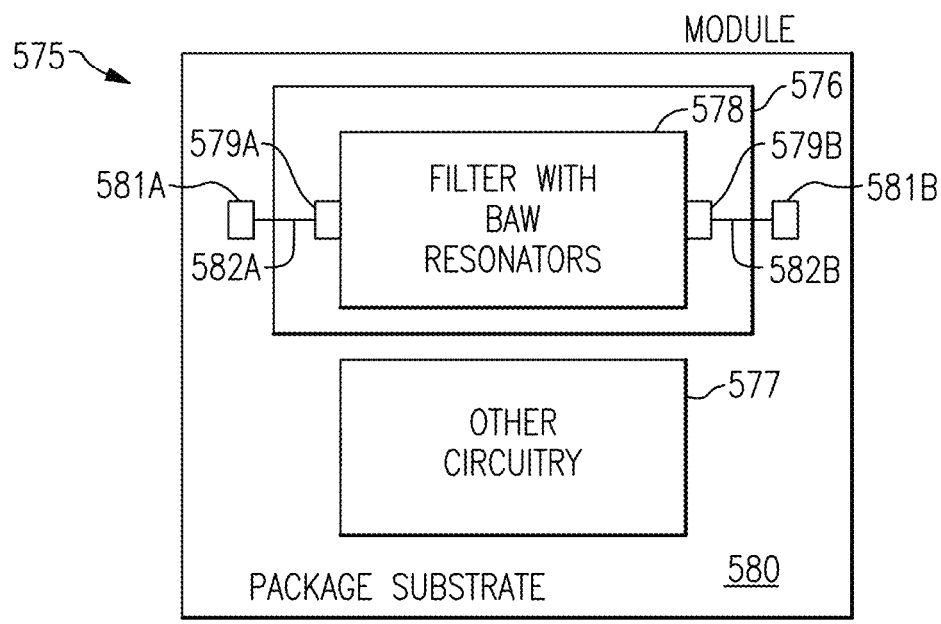
FIG. 9 is a schematic diagram of a radio frequency module that includes a bulk acoustic wave resonator according to an embodiment.

FIG. 9 is a schematic diagram of a radio frequency module 575 that includes an acoustic wave component 576 according to an embodiment. The illustrated radio frequency module 575 includes the BAW component 576 and other circuitry 577. The BAW component 576 can include one or more BAW resonators with any suitable combination of features of the BAW resonators disclosed herein. The BAW component 576 can include a BAW die that includes BAW resonators.

The BAW component 576 shown in FIG. 9 includes a filter 578 and terminals 579A and 579B. The filter 578 includes BAW resonators. One or more of the BAW resonators can be implemented in accordance with any suitable principles and advantages of the acoustic wave devices 20, 20A of the packaged acoustic wave components 100, 100A of FIGS. 1-2 and/or any acoustic wave resonator disclosed herein. The terminals 579A and 578B can serve, for example, as an input contact and an output contact. The BAW component 576 and the other circuitry 577 are on a common packaging substrate 580 in FIG. 9. The package substrate 580 can be a laminate substrate. The terminals 579A and 579B can be electrically connected to contacts 581A and 581B, respectively, on the packaging substrate 580 by way of electrical connectors 582A and 582B, respectively. The electrical connectors 582A and 582B can be bumps or wire bonds, for example. The other circuitry 577 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 575 can include one or more packaging structures to, for example, provide protection and/or facilitate easier handling of the radio frequency module 575. Such a packaging structure can include an overmold structure formed over the packaging substrate 580. The overmold structure can encapsulate some or all of the components of the radio frequency module 575.

Figure 10:
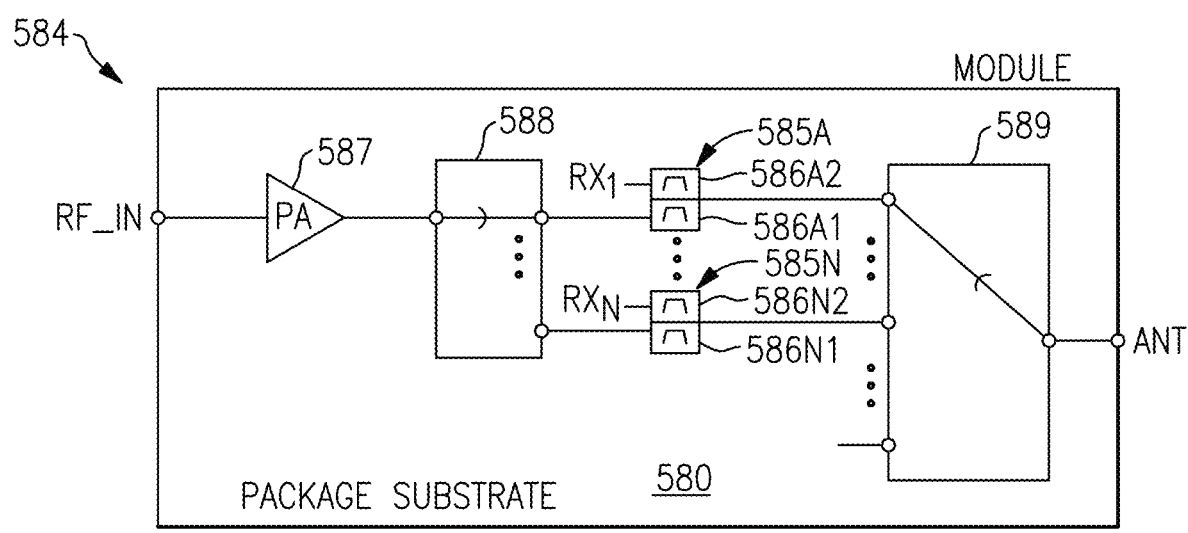
FIG. 10 is a schematic diagram of a radio frequency module that includes filters with acoustic wave resonators according to an embodiment.

FIG. 10 is a schematic diagram of a radio frequency module 584 that includes a bulk acoustic wave resonator according to an embodiment. As illustrated, the radio frequency module 584 includes duplexers 585A to 585N that include respective transmit filters 586A1 to 586N1 and respective receive filters 586A2 to 586N2, a power amplifier 587, a select switch 588, and an antenna switch 589. In some instances, the module 584 can include one or more low noise amplifiers configured to receive a signal from one or more receive filters of the receive filters 586A2 to 586N2. The radio frequency module 584 can include a package that encloses the illustrated elements. The illustrated elements can be disposed on a common packaging substrate 580. The packaging substrate can be a laminate substrate, for example.

The duplexers 585A to 585N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 586A1 to 586N1 can include one or more BAW resonators in accordance with any suitable principles and advantages disclosed herein. Similarly, one or more of the receive filters 586A2 to 586N2 can include one or more BAW resonators in accordance with any suitable principles and advantages disclosed herein. Although FIG. 10 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 587 can amplify a radio frequency signal. The illustrated switch 588 is a multi-throw radio frequency switch. The switch 588 can electrically couple an output of the power amplifier 587 to a selected transmit filter of the transmit filters 586A1 to 586N1. In some instances, the switch 588 can electrically connect the output of the power amplifier 587 to more than one of the transmit filters 586A1 to 586N1. The antenna switch 589 can selectively couple a signal from one or more of the duplexers 585A to 585N to an antenna port ANT. The duplexers 585A to 585N can be associated with different frequency bands and/or different modes of operation (e.g., different power modes, different signaling modes, etc.).

Figure 11:
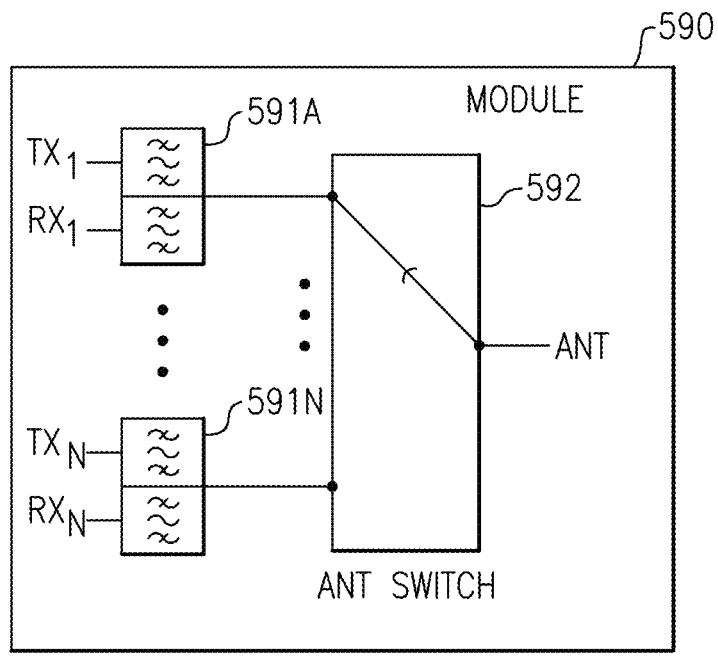
FIG. 11 is a schematic block diagram of a module that includes an antenna switch and duplexers that include an acoustic wave resonator according to an embodiment.

FIG. 11 is a schematic block diagram of a module 590 that includes duplexers 591A to 591N and an antenna switch 592. One or more filters of the duplexers 591A to 591N can include any suitable number of bulk acoustic wave resonators in accordance with any suitable principles and advantages discussed herein. Any suitable number of duplexers 591A to 591N can be implemented. The antenna switch 592 can have a number of throws corresponding to the number of duplexers 591A to 591N. The antenna switch 592 can electrically couple a selected duplexer to an antenna port of the module 590.

Figure 12A:
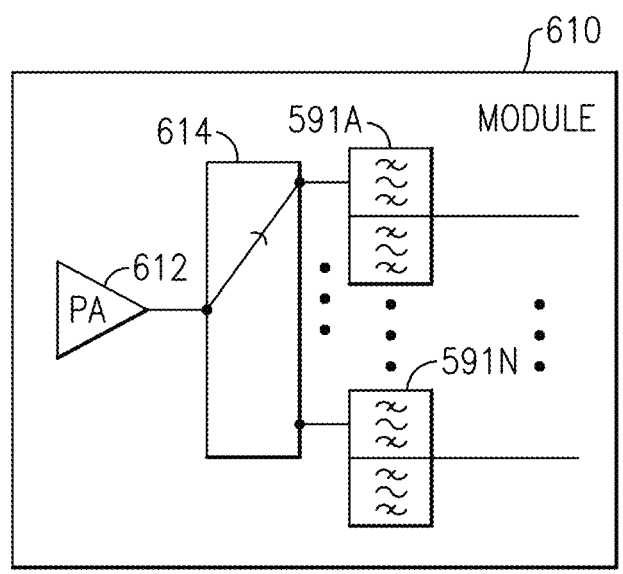
FIG. 12A is a schematic block diagram of a module that includes a power amplifier, a radio frequency switch, and duplexers that include an acoustic wave resonator according to an embodiment.

FIG. 12A is a schematic block diagram of a module 610 that includes a power amplifier 612, a radio frequency switch 614, and duplexers 591A to 591N in accordance with one or more embodiments. The power amplifier 612 can amplify a radio frequency signal. The radio frequency switch 614 can be a multi-throw radio frequency switch. The radio frequency switch 614 can electrically couple an output of the power amplifier 612 to a selected transmit filter of the duplexers 591A to 591N. One or more filters of the duplexers 591A to 591N can include any suitable number of bulk acoustic wave resonators in accordance with any suitable principles and advantages discussed herein. Any suitable number of duplexers 591A to 591N can be implemented.

Figure 12B:
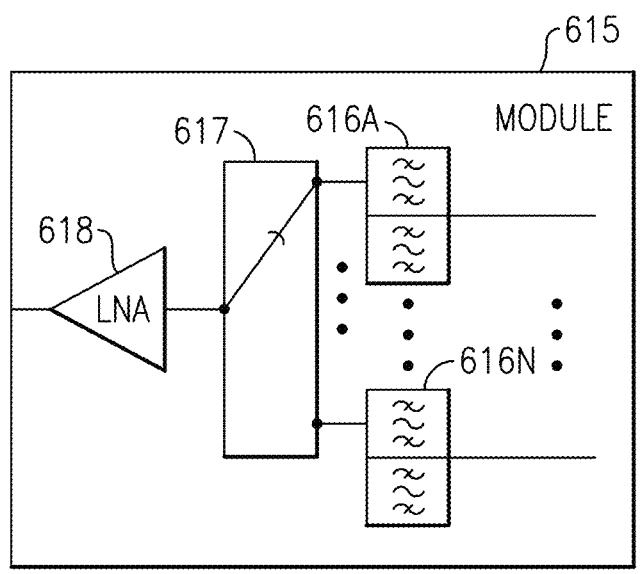
FIG. 12B is a schematic block diagram of a module that includes filters, a radio frequency switch, and a low noise amplifier according to an embodiment.

FIG. 12B is a schematic block diagram of a module 615 that includes filters 616A to 616N, a radio frequency switch 617, and a low noise amplifier 618 according to an embodiment. One or more filters of the filters 616A to 616N can include any suitable number of acoustic wave resonators in accordance with any suitable principles and advantages disclosed herein. Any suitable number of filters 616A to 616N can be implemented. The illustrated filters 616A to 616N are receive filters. In some embodiments (not illustrated), one or more of the filters 616A to 616N can be included in a multiplexer that also includes a transmit filter. The radio frequency switch 617 can be a multi-throw radio frequency switch. The radio frequency switch 617 can electrically couple an output of a selected filter of filters 616A to 616N to the low noise amplifier 618. In some embodiments (not illustrated), a plurality of low noise amplifiers can be implemented. The module 615 can include diversity receive features in certain applications.

Figure 13A:
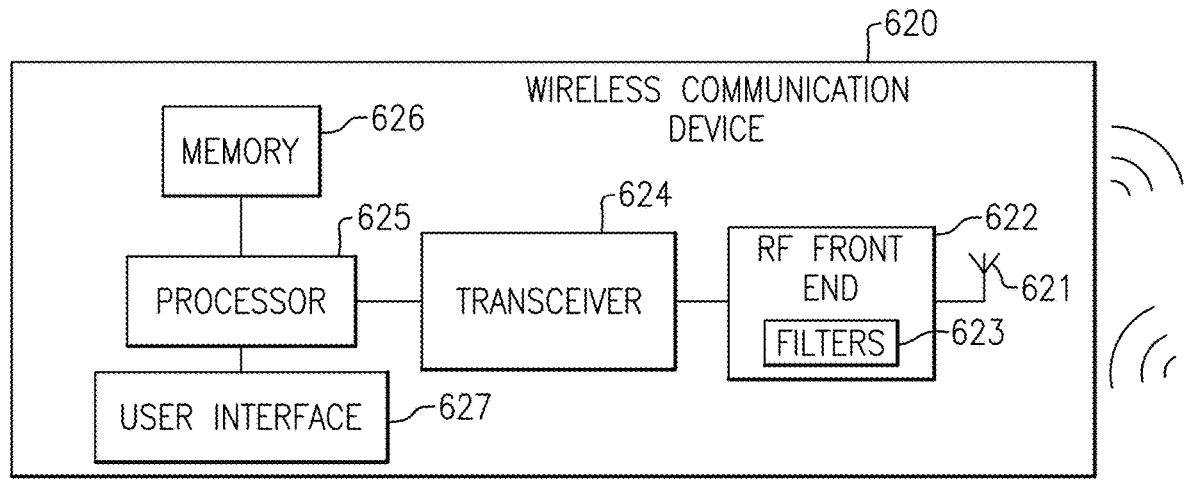
FIG. 13A is a schematic block diagram of a wireless communication device that includes a filter with an acoustic wave resonator in accordance with one or more embodiments.

FIG. 13A is a schematic diagram of a wireless communication device 620 that includes filters 623 in a radio frequency front end 622 according to an embodiment. The filters 623 can include one or more BAW resonators in accordance with any suitable principles and advantages discussed herein. The wireless communication device 620 can be any suitable wireless communication device. For instance, a wireless communication device 620 can be a mobile phone, such as a smart phone. As illustrated, the wireless communication device 620 includes an antenna 621, an RF front end 622, a transceiver 624, a processor 625, a memory 626, and a user interface 627. The antenna 621 can transmit/receive RF signals provided by the RF front end 622. Such RF signals can include carrier aggregation signals. Although not illustrated, the wireless communication device 620 can include a microphone and a speaker in certain applications.

The RF front end 622 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 622 can transmit and receive RF signals associated with any suitable communication standards. The filters 623 can include BAW resonators of a BAW component that includes any suitable combination of features discussed with reference to any embodiments discussed above.

The transceiver 624 can provide RF signals to the RF front end 622 for amplification and/or other processing. The transceiver 624 can also process an RF signal provided by a low noise amplifier of the RF front end 622. The transceiver 624 is in communication with the processor 625. The processor 625 can be a baseband processor. The processor 625 can provide any suitable base band processing functions for the wireless communication device 620. The memory 626 can be accessed by the processor 625. The memory 626 can store any suitable data for the wireless communication device 620. The user interface 627 can be any suitable user interface, such as a display with touch screen capabilities.

Figure 13B:
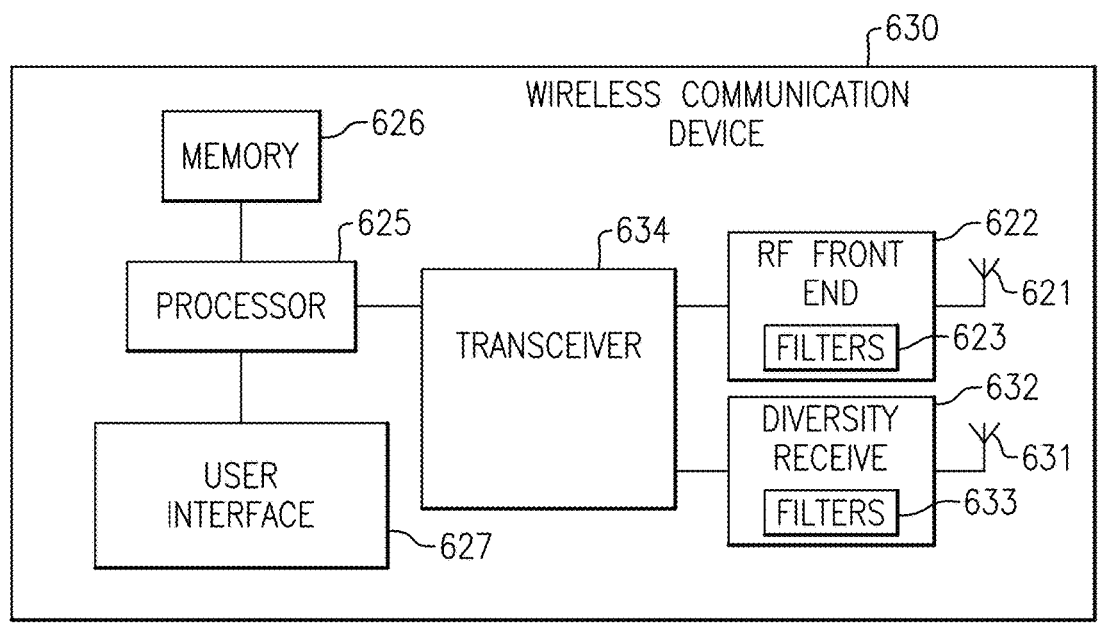
FIG. 13B is a schematic block diagram of another wireless communication device that includes a filter with an acoustic wave resonator in accordance with one or more embodiments.

FIG. 13B is a schematic diagram of a wireless communication device 630 that includes filters 623 in a radio frequency front end 622 and a second filter 633 in a diversity receive module 632. The wireless communication device 630 is like the wireless communication device 620 of FIG. 13A, except that the wireless communication device 630 also includes diversity receive features. As illustrated in FIG. 13B, the wireless communication device 630 includes a diversity antenna 631, a diversity module 632 configured to process signals received by the diversity antenna 631 and including filters 633, and a transceiver 634 in communication with both the radio frequency front end 622 and the diversity receive module 632. The filters 633 can include one or more BAW resonators that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of manufacturing a packaged acoustic wave component, the method comprising:
    forming or providing a planar cap substrate;
    forming a metal shield plate on a surface of the planar cap substrate; and
    bonding the planar cap substrate to a device substrate that has an acoustic wave device on a surface thereof such that the metal shield plate is spaced from and faces the acoustic wave device and so that a peripheral metal wall extends between and attaches the device substrate and the metal shield plate, at least a portion of the peripheral metal wall being a monolithic piece with, and of a same material as, the metal shield plate, the metal shield plate and the peripheral metal wall enclosing and electrically shielding the acoustic wave device.

2. The method of claim 1 wherein the acoustic wave device is a bulk acoustic wave device.

3. The method of claim 1 wherein forming the peripheral metal wall includes forming a first portion of a first material that is attached to the device substrate and forming a second portion of a second material that is attached to the metal shield plate, the second material being different than the first material.

4. The method of claim 3 wherein forming the peripheral metal wall includes forming a third portion of a third material different than the first material and the second material, the third portion interposed between the first portion and the second portion.

5. The method of claim 3 wherein forming the first portion and forming the second portion includes forming the first portion to have a length greater than a length of the second portion.

6. The method of claim 3 wherein forming the first portion and forming the second portion includes forming the first portion to have a width greater than a width of the second portion.

7. The method of claim 1 wherein the metal shield plate includes copper.

8. The method of claim 1 wherein forming the metal shield plate includes forming the metal shield plate to have a thickness of 5 um.

9. The method of claim 1 wherein the device substrate has a higher resistance than the planar cap substrate.

10. The method of claim 1 wherein a bottom surface of the metal shield plate is spaced above the acoustic wave device by between approximately 7 um and 13 um.

11. The method of claim 10 wherein the bottom surface of the metal shield plate is spaced above the acoustic wave device by approximately 10 um.

12. A method of manufacturing a packaged acoustic wave component, the method comprising:
forming or providing a planar cap substrate;
forming a metal shield plate on a surface of the planar cap substrate;
forming a peripheral metal wall attached to the metal shield plate, at least a portion of the peripheral metal wall being a monolithic piece with, and of a same material as, the metal shield plate;
forming or providing a device substrate;
mounting an acoustic wave device on a surface of the device substrate; and
stacking the planar cap substrate over the device substrate so that the peripheral metal wall extends and attaches to the device substrate and so that the metal shield plate faces the acoustic wave device, the metal shield plate and peripheral metal wall electrically shielding the acoustic wave device.

13. The method of claim 12 wherein the acoustic wave device is a bulk acoustic wave device.

14. The method of claim 12 wherein forming the peripheral metal wall includes forming a first portion of a first material that is attached to the device substrate and forming a second portion of a second material that is attached to the metal shield plate, the second material being different than the first material.

15. The method of claim 14 wherein forming the peripheral metal wall includes forming a third portion of a third material different than the first material and the second material, the third portion interposed between the first portion and the second portion.

16. The method of claim 14 wherein forming the first portion and forming the second portion includes forming the first portion to have a length greater than a length of the second portion.

17. The method of claim 14 wherein forming the first portion and forming the second portion includes forming the first portion to have a width greater than a width of the second portion.

18. The method of claim 12 wherein the metal shield plate includes copper.

19. The method of claim 12 wherein forming the metal shield plate includes forming the metal shield plate to have a thickness of 5 um.

20. The method of claim 12 wherein the device substrate has a higher resistance than the planar cap substrate.

* * * * *